(12) United States Patent
Matsushima et al.

(10) Patent No.: US 7,149,084 B2
(45) Date of Patent: Dec. 12, 2006

(54) REDUNDANT LIQUID COOLING SYSTEM AND ELECTRONIC APPARATUS HAVING THE SAME THEREIN

(75) Inventors: Hitoshi Matsushima, Ryugasaki (JP); Ichirou Asano, Seto (JP)

(73) Assignee: Hitachi, Ltd., Tokyo (JP)

( * ) Notice: Subject to any disclaimer, the term of this patent is extended or adjusted under 35 U.S.C. 154(b) by 92 days.

(21) Appl. No.: 10/792,718

(22) Filed: Mar. 5, 2004

(65) Prior Publication Data

US 2005/0180105 A1    Aug. 18, 2005

(30) Foreign Application Priority Data

Feb. 16, 2004  (JP) ............................. 2004-038358

(51) Int. Cl.
*H05K 7/20* (2006.01)
(52) U.S. Cl. ............ 361/699; 257/714; 165/80.4; 174/15.1; 62/259.2
(58) Field of Classification Search ........... 361/699; 257/714; 174/15.1; 165/80.4; 62/259.2
See application file for complete search history.

(56) References Cited

U.S. PATENT DOCUMENTS

| 5,048,598 | A  | * | 9/1991  | Takemae et al. ........ 165/104.14 |
| 6,166,907 | A  | * | 12/2000 | Chien ........................ 361/699 |
| 6,182,742 | B1 | * | 2/2001  | Takahashi et al. ...... 165/104.33 |
| 6,234,240 | B1 | * | 5/2001  | Cheon ........................ 165/80.3 |
| 6,351,381 | B1 | * | 2/2002  | Bilski et al. ................. 361/695 |
| 6,587,343 | B1 | * | 7/2003  | Novotny et al. ............ 361/698 |
| 6,711,017 | B1 | * | 3/2004  | Kurokawa et al. .......... 361/699 |
| 6,807,056 | B1 | * | 10/2004 | Kondo et al. ............... 361/689 |
| 6,885,556 | B1 | * | 4/2005  | Kondo et al. ............... 361/699 |
| 2003/0151892 | A1 |   | 8/2003  | Kondo et al. |
| 2004/0008483 | A1 | * | 1/2004  | Cheon ........................ 361/687 |
| 2004/0233632 | A1 | * | 11/2004 | Chang ........................ 361/687 |
| 2005/0078451 | A1 | * | 4/2005  | Sauciuc et al. ............. 361/700 |

FOREIGN PATENT DOCUMENTS

KR    2002-0024752    4/2002

OTHER PUBLICATIONS

Korean Office Action in Korean Patent Application No. 10-2000-0056557, dated Dec. 2, 2005.

* cited by examiner

*Primary Examiner*—Boris Chervinsky
(74) *Attorney, Agent, or Firm*—Antonelli, Terry, Stout and Kraus, LLP.

(57) ABSTRACT

In an electronic apparatus, including personal computers, being called by a desktop type and a notebook type, as well as a server, etc., comprising a redundant cooling system, mounting a CPU 200 necessitating cooling in a housing 100, wherein a liquid cooling system for cooling the CPU comprises: a cooling jacket 50; a radiator 60; and two (2) sets of circulation pumps, and there are further provided check valves 91 and 92 and conduits 81, 82 . . . , so as to maintain circulation of the liquid coolant even when one of the two (2) sets of circulation pumps stops the function thereof, through the other circulation pump, thereby built up a redundant liquid cooling system.

9 Claims, 13 Drawing Sheets p71 < p72 p71 > p72

REDUNDANT LIQUID COOLING SYSTEM AND ELECTRONIC APPARATUS HAVING THE SAME THEREIN

BACKGROUND OF THE INVENTION

The present invention relates to an electronic apparatus, such as, a personal computer, being so-called a desktop-type or a notebook-type, or a server, etc., and in particular, it relates to an electronic apparatus having a liquid cooling system therein, being able to cool down a heat-generation element mounted within an inside thereof, such as, a semiconductor integrated circuit (IC), effectively with an aid of a liquid refrigerant or coolant, as well as, the cooling system thereof.

In order to maintain a normal operation thereof, cooling is necessary for the heat-generation element, such as, the semiconductor IC element, being mounted within electronic apparatuses, including personal computers, being so-called the desktop-type and the notebook-type, as well as, a server, etc., and in particular, the heat-generation element, such as, a CPU (Central Processing Unit), as a representative one thereof, for example. For this reason, conventionally, such the cooling is achieved generally by using a heat transfer element, being so-called a heat sink that is formed with fins thereon, as well as a fan, being provided for sending a cooling air thereto. However, small-sizing and high integration of such the semiconductor IC element, such the heat-generation element as was mentioned above, in recent years, brings about the localization of heat generating at a portion thereof within the heat-generation element, and also for this reason, attention comes to be paid onto a cooling system of a liquid type of using the liquid coolant therein, such as a water, for example, being high in the cooling efficiency thereof, in the place of the conventional cooling system of an air-cooling type.

Namely, with the liquid cooling system of being high in the cooling efficiency thereof, which is used in the personal computers, so-called the desktop-type and the notebook-type, and also the server, etc., as is known from the following patent documents, for example, in general, an element being so-called by a heat-receiving (or cooler) jacket is mounted on the surface of the heat-generating element, i.e., the CPU, directly, while conducting the liquid coolant within a flow passage formed within the heat-receiving jacket, so as to transmit or convey the heat generated from the CPU to the coolant flowing within the jacket mentioned above, thereby cooling down the heat-generating element with high efficiency. Further, in such the cooling system of the liquid-cooling type, normally, a heat cycle is made up with the cooler jacket, as the heat-receiving portion thereof, and in more details thereof, it comprises a circulation pump for circulating the liquid coolant mentioned above within the cycle, so-called a radiator, being a heat-radiation portion for irradiating heat of the liquid coolant mentioned above into an outside, and further a coolant tank provided in a part of the cycle depending on the necessity thereof. And, those are connected through a tube made of a metal and/or an elastic material, such as rubber, or the like.

Patent Document 1: Japanese Patent Laying-Open No. 2003-304086 (2003);

Patent Document 2: Japanese Patent Laying-Open No. 2003-22148 (2003);

Patent Document 3: Japanese Patent Laying-Open No. 2002-182797 (2002);

Patent Document 4: Japanese Patent Laying-Open No. 2002-189536 (2002); and

Patent Document 5: Japanese Patent Laying-Open No. 2002-188876 (2002).

However, with such the conventional arts as was mentioned above, in particular, with the cooling system of the liquid-cooling type being high in the efficiency thereof, which is used in the personal computers, so-called the desktop-type and the notebook-type, and also the server, etc., as was mentioned previously the circulation pump, being provided in a part of the heat cycle for driving the liquid coolant, is normally only one (1) piece, and therefore, in a case when this circulation pump is in trouble due to any reason, it is impossible to circulate the coolant within the heat cycle building up the cooling system. In such the case, the heat-generation element, i.e., the CPU, comes to be high in the temperature thereof due to the heat generation of itself, and it falls down into the so-called thermal runaway, or the thermal breakdown depending on the cases, thereby causing a trouble or/and stoppage (or stall) of the apparatus. However, for the personal computer, with provision of such a means for detecting the trouble or failure of this circulation pump, thereby warning a user of the trouble detected therewith, through such as an alarm lamp or the like, for example, it is possible to avoid the trouble/stoppage of the apparatus due to such the trouble of the circulation pump, through letting the user to stop the operation of an apparatus once, so as to repair the pump in the trouble or to exchange it with a new one.

However, in such the case, it is necessary to stop the operation of the apparatus, once, in spite of the condition of the job, by turning OFF the electric power source thereof, etc., therefore it causes troublesome for an operator who is in the condition of using the personal computer. Furthermore, in particular, for such the apparatus, being represented by the server, for example, since it is connected with a plural number of computers, always, therefore there is a problem that the apparatus cannot be stopped, immediately, even if such the trouble happens as mentioned above occurs in the circulation pump.

SUMMARY OF THE INVENTION

Namely, according to the present invention, being accomplished by taking such the problems of the conventional arts as were mentioned above into the consideration thereof, an object thereof is to provide a liquid cooling system, being suitable to be used in such the personal computer, being so-called the desktop-type or the notebook-type, and also the server, etc., being high in the cooling efficiency thereof, and also having redundancy, as well as, an electronic apparatus having such the cooling system therein.

According to the present invention, for accomplishing such the object mentioned above, firstly, there is provided an electronic apparatus, installing a semiconductor element generating heart within an inside of a housing, thereby necessitating cooling for maintaining a normal operation thereof, and including a cooling system within the inside of said housing or in a portion thereof, said cooling system comprising: a cooling jacket being thermally connected to the semiconductor element, for transmitting heat generated therefrom into a liquid coolant flowing inside thereof; a radiator for radiating the heat transmitted into the liquid coolant in said cooling jacket into an outside of the apparatus; and a circulation pump for circulating said liquid coolant within a loop, including said cooling jacket and said radiator therein, wherein: said circulation pump is provided in a plural number thereof, and further including means for maintaining circulation of said liquid coolant, if one of said plural number of circulation pumps stops function thereof, through the others thereof.

Also, according to the present invention, in the electronic apparatus having the liquid cooling system therein, as described in the above, wherein two (2) sets of said circulation pumps are connected in series, and said liquid coolant circulation maintaining means comprises flow passages, being connected to said two (2) sets of circulation pumps, respectively, and check valves, each being attached to a portion of each of the flow passages, or, wherein two (2) sets of said circulation pumps are connected in parallel, and said liquid coolant circulation maintaining means comprises a three-way valve connected to said two (2) sets of circulation pumps.

Further, according to the present invention, in the electronic apparatus having the liquid cooling system therein, as described in the above, wherein said liquid coolant circulation maintaining means further comprises a means for increasing rotation velocity of said other circulation pumps when the one of said plural number of circulation pumps stop the function thereof, and further wherein said rotation velocity increase means for the circulation pumps is built up with using a portion of said semiconductor element. In addition thereto, said liquid coolant circulation maintaining means may further comprises an alarm means for warning of stoppage of said function when the one of said plural number of circulation pumps stop the function thereof, or said liquid cooling system may further comprises a tank being able to supply the liquid coolant therefrom, always in spite of dispositional direction thereof.

In addition thereof, according to the present invention, for accomplishing such the object mentioned above, there is provided a cooling system for cooling a semiconductor element generating heat therefrom, comprising: a cooling jacket being thermally connected to a semiconductor element, for transmitting heat generated therefrom into a liquid coolant flowing inside thereof; a radiator for radiating the heat transmitted into the liquid coolant in said cooling jacket into an outside of the apparatus; and a circulation pump for circulating said liquid coolant within a loop, including said cooling jacket and said radiator therein, wherein: said circulation pump is provided in a plural number thereof, and further including means for maintaining circulation of said liquid coolant, if one of said plural number of circulation pumps stops function thereof, through the others thereof.

And further, according to the present invention, also for accomplishing such the object mentioned above, there is further provided a cooling system for cooling a semiconductor element generating heat therefrom, comprising: a cooling jacket being thermally connected to a semiconductor element, for transmitting heat generated therefrom into a liquid coolant flowing inside thereof; a radiator for radiating the heat transmitted into the liquid coolant in said cooling jacket into an outside of the apparatus; and a circulation pump for circulating said liquid coolant within a loop, including said cooling jacket and said radiator therein, and further comprising: a coolant tank, being divided in an inside thereof into a plural number of spaces, in an upstream side of said circulation pump.

BRIEF DESCRIPTION OF THE VARIOUS VIEWS OF THE DRAWING

Those and other features, objects and advantages of the present invention will become more apparent from the following description when taken in conjunction with the accompanying drawings wherein.

Figure 4A:
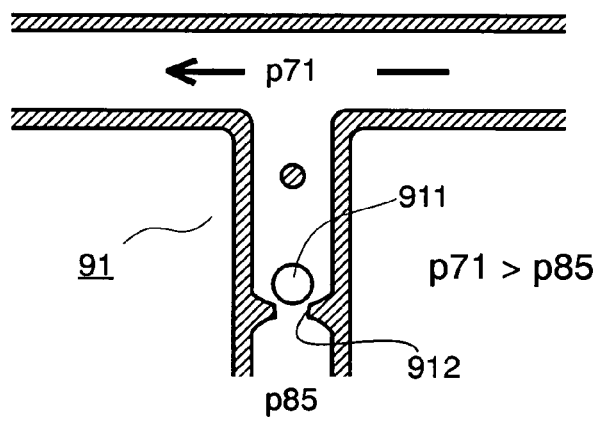
Figure 4B:
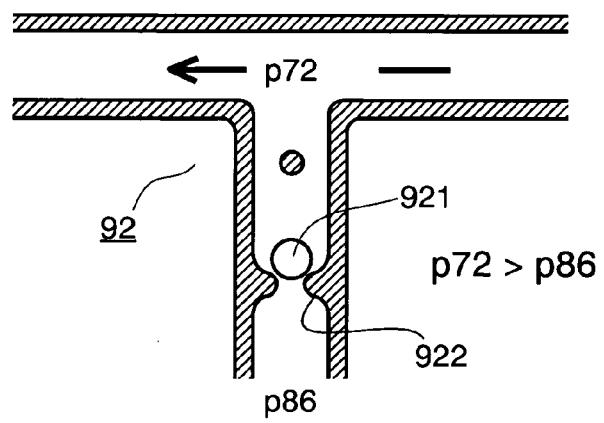
Figure 5:
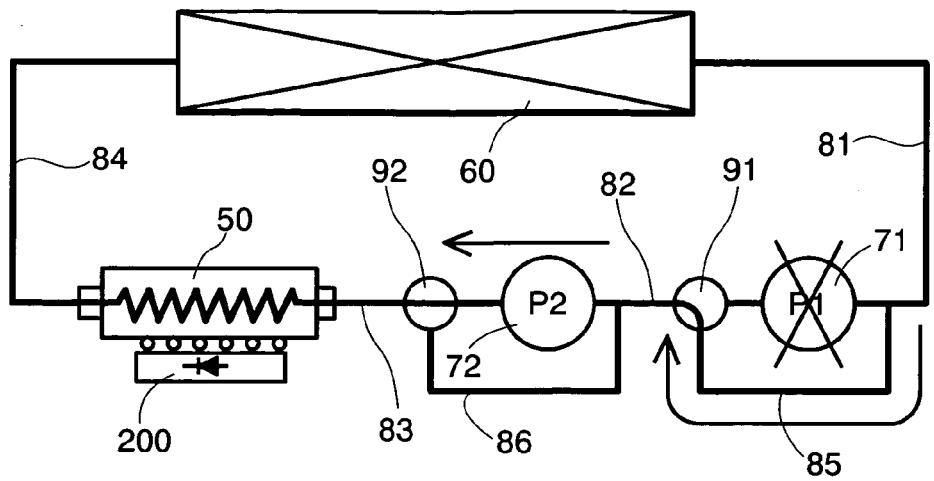
Figure 6A:
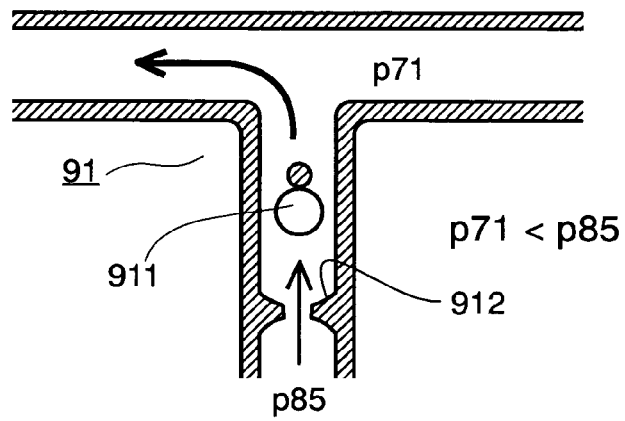
Figure 6B:
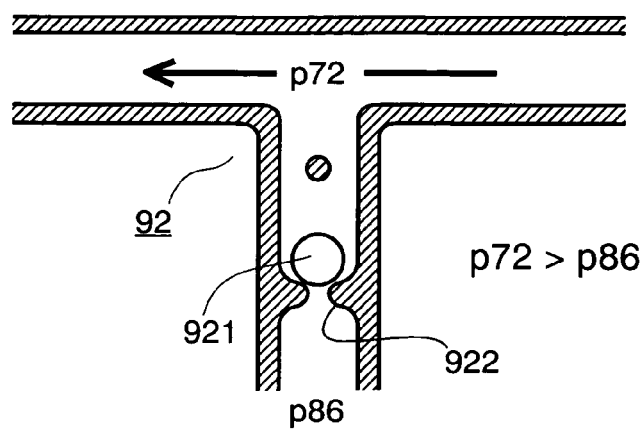
Figure 7:
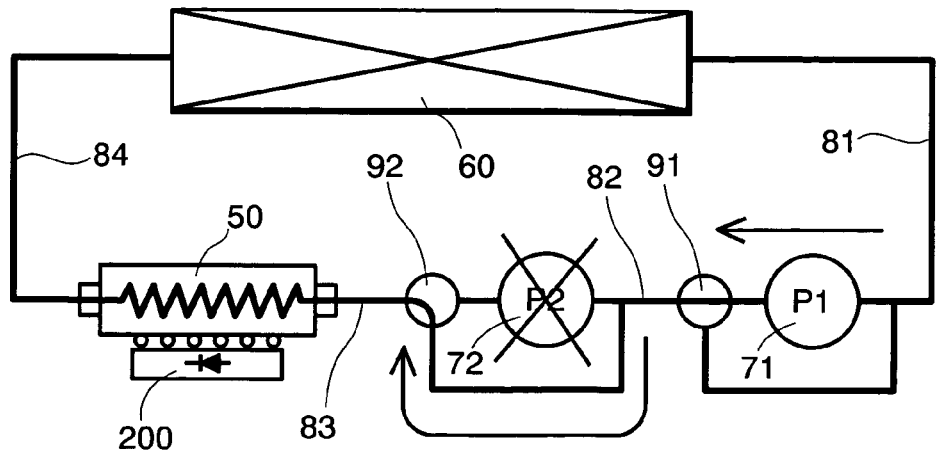
Figure 8A:
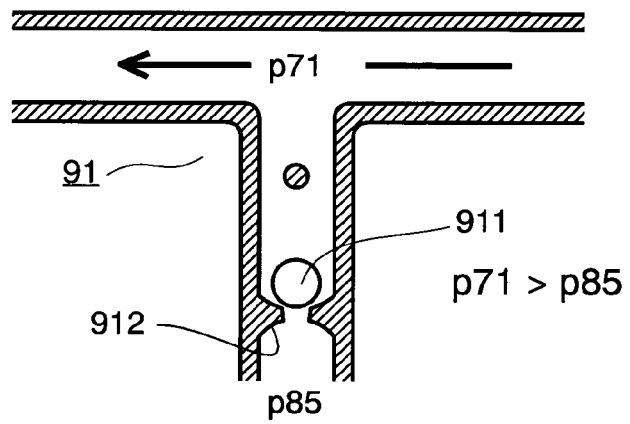
Figure 8B:
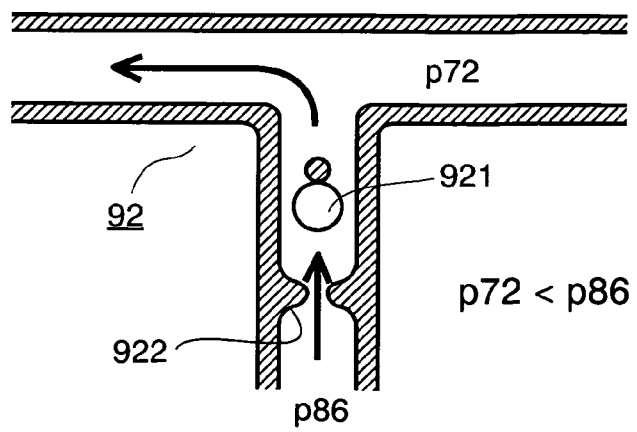
Figure 9:
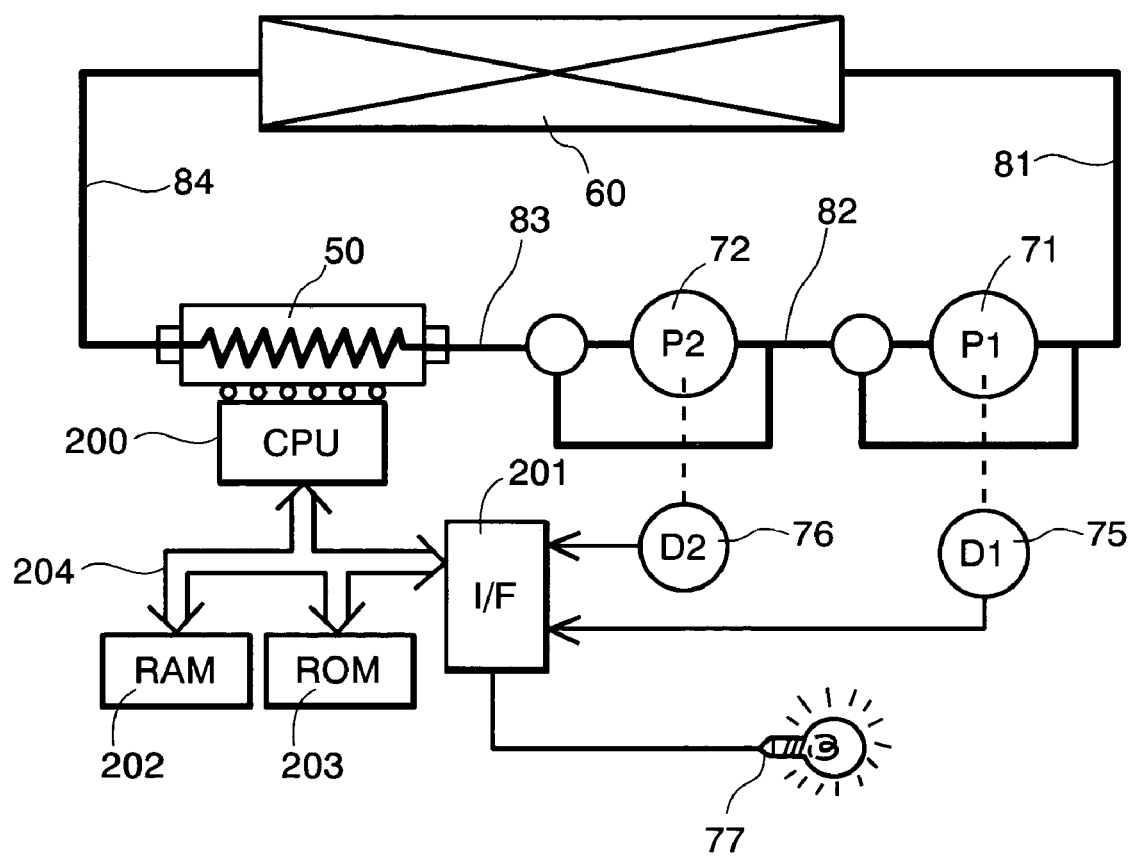
Figure 10A:
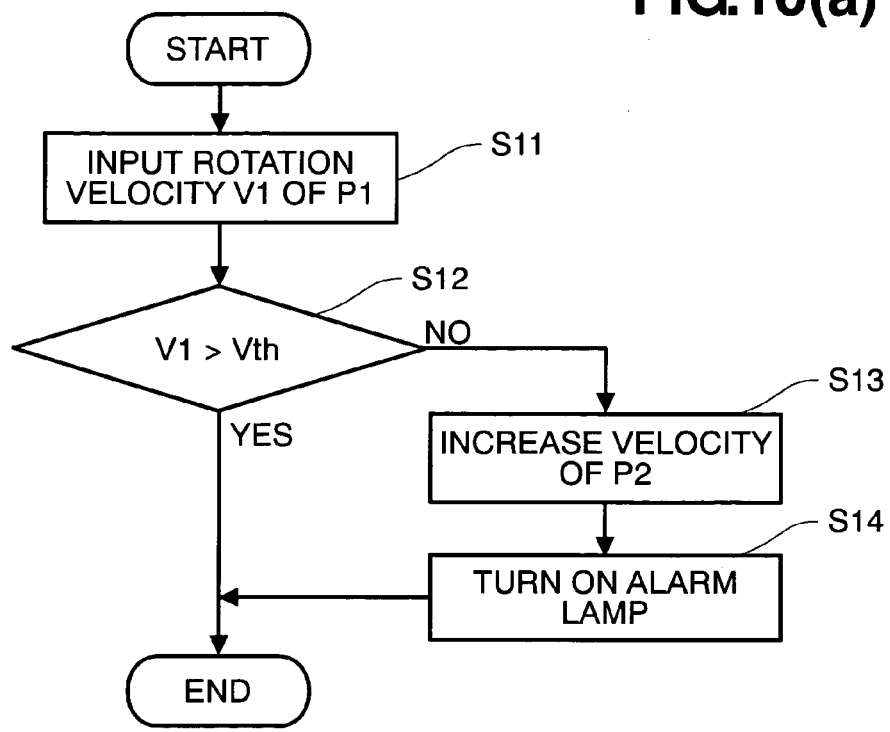
Figure 10B:
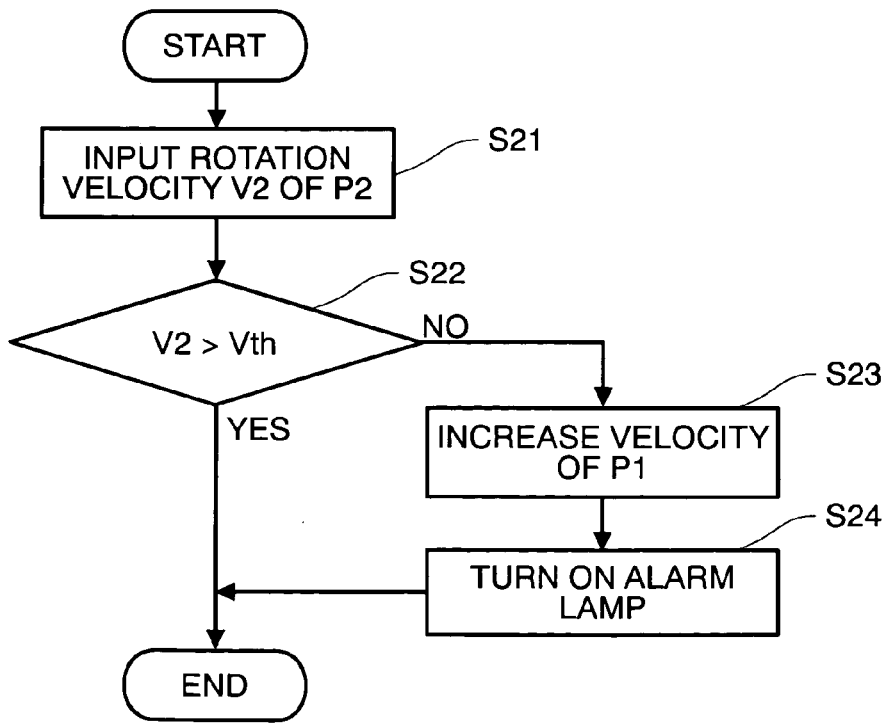
Figure 11A:
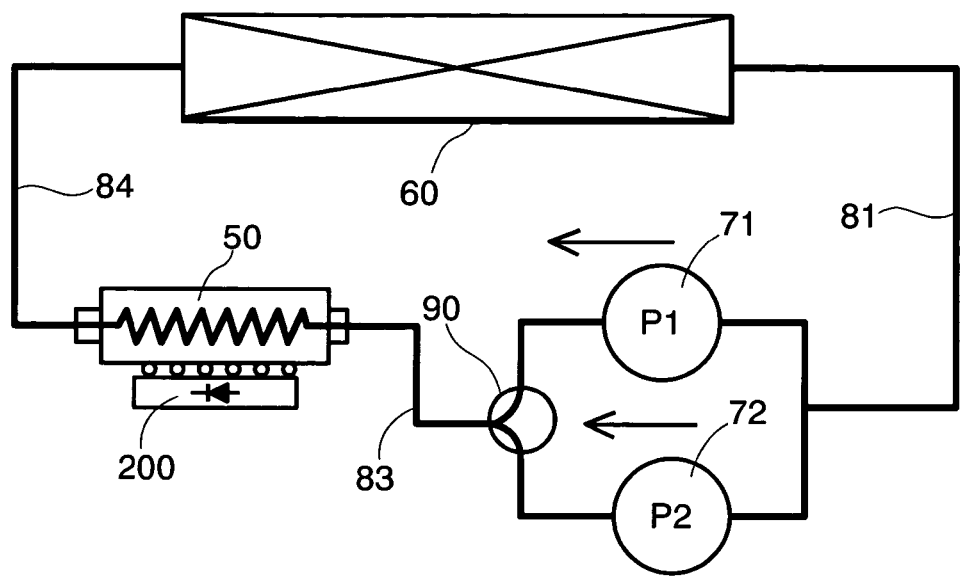
Figure 11B:
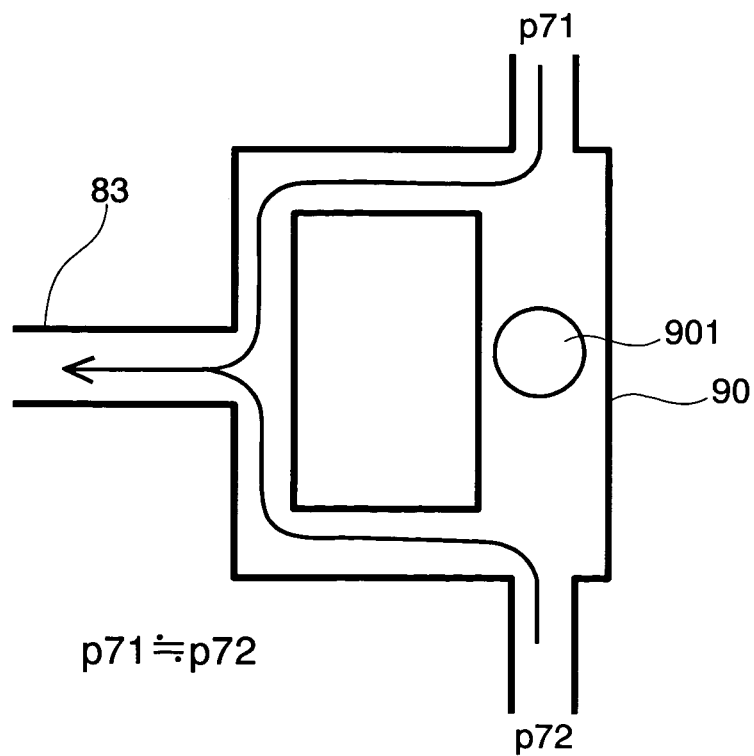
Figure 12A:
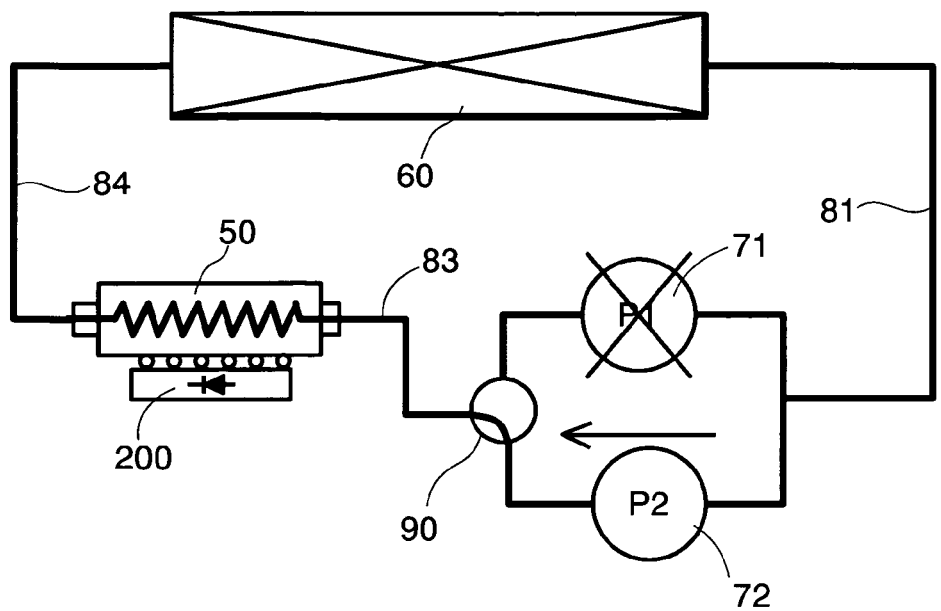
Figure 12B:
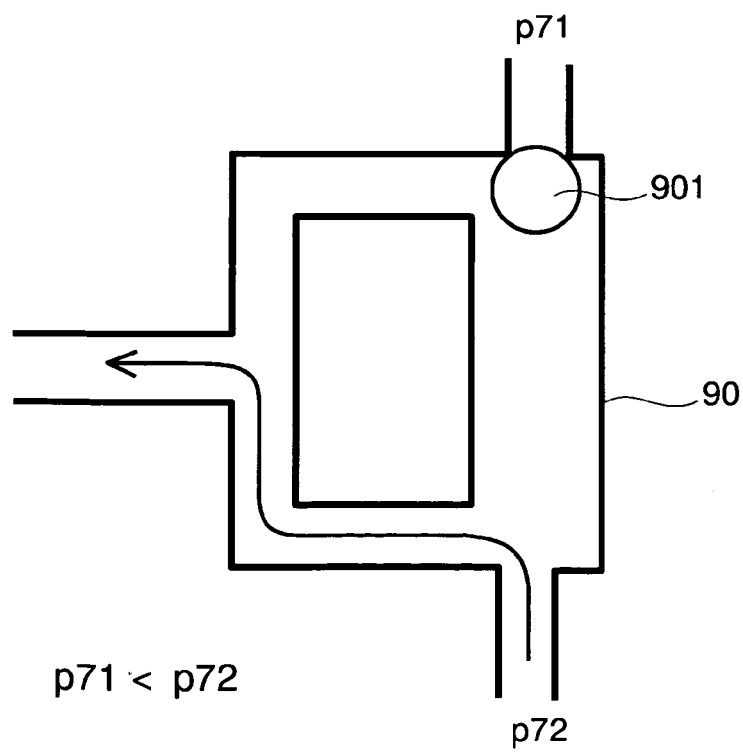
Figure 13A:
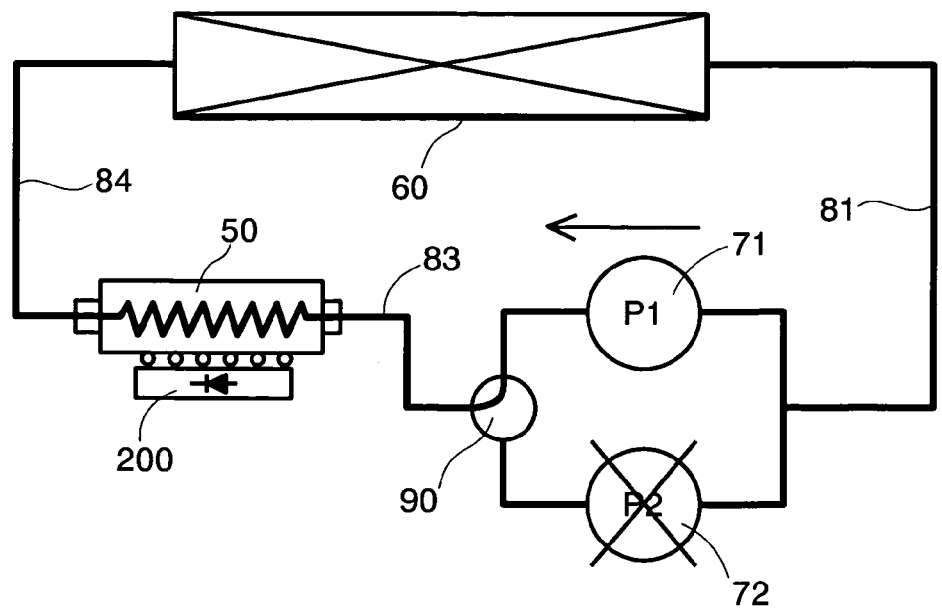
Figure 13B:
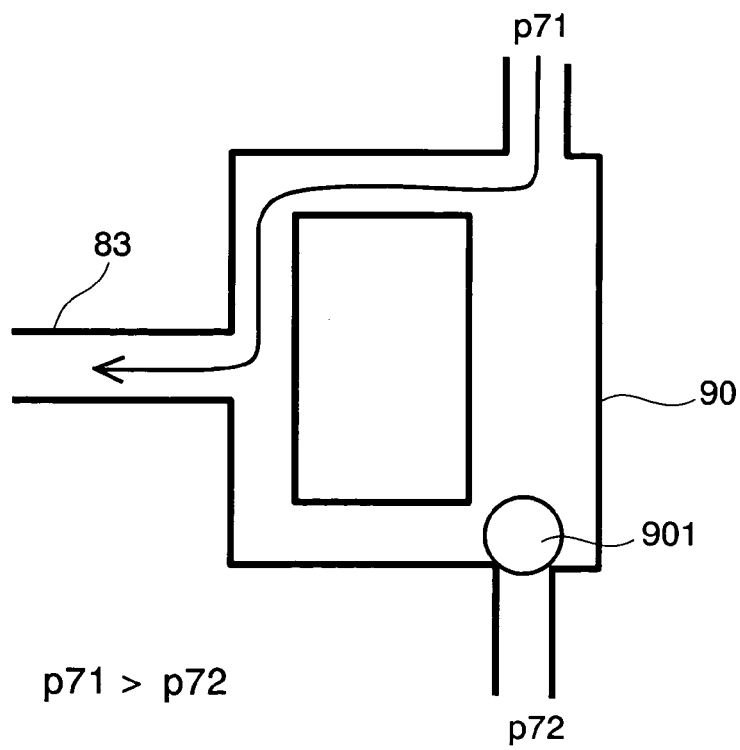
Figure 14:
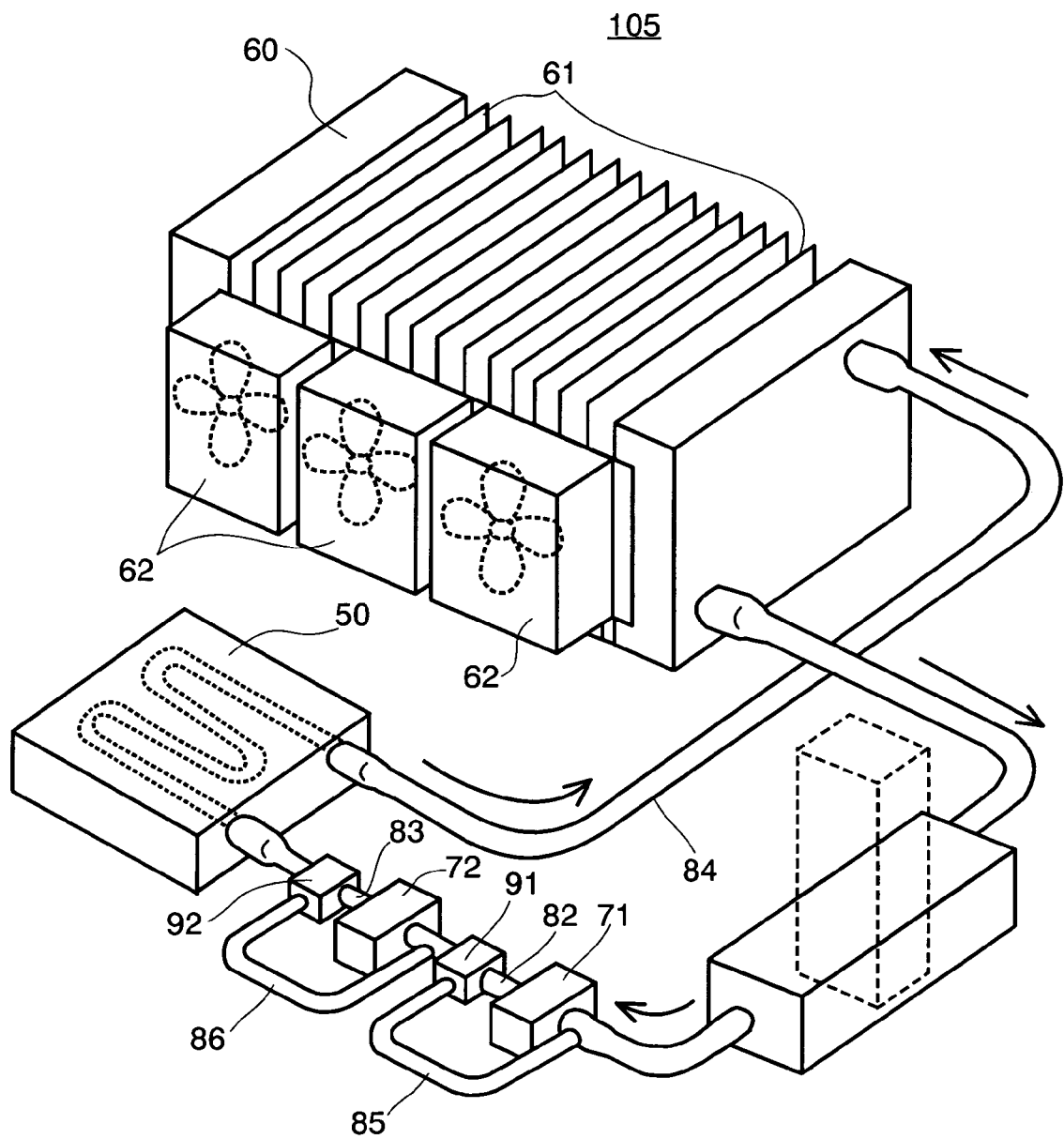
Figure 15A:
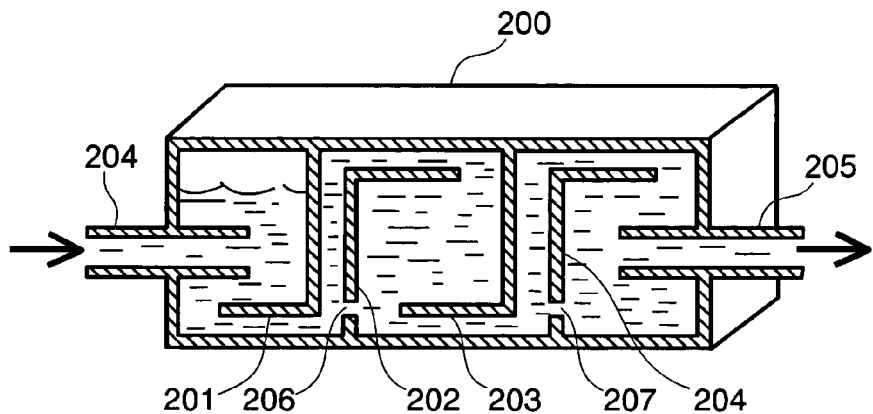
Figure 15B:
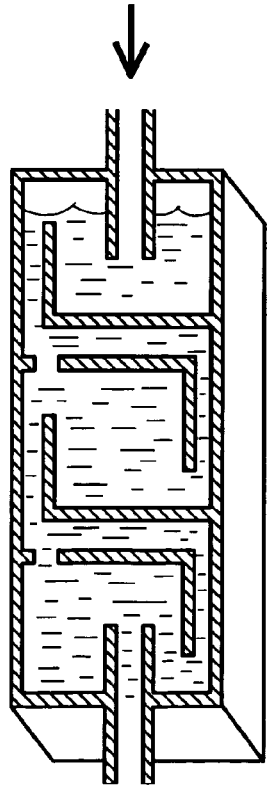
Figure 16A:
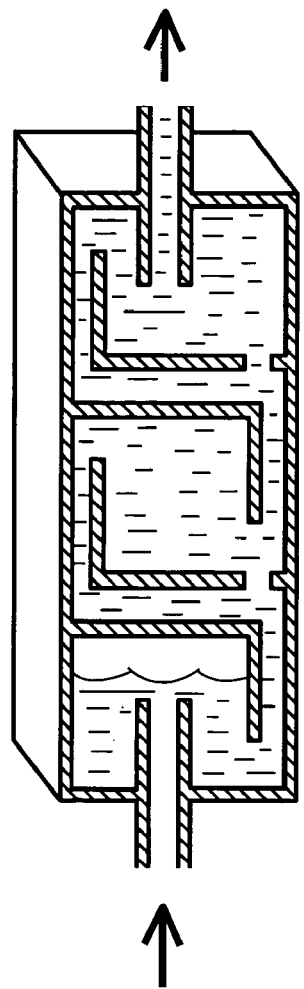
Figure 16B:
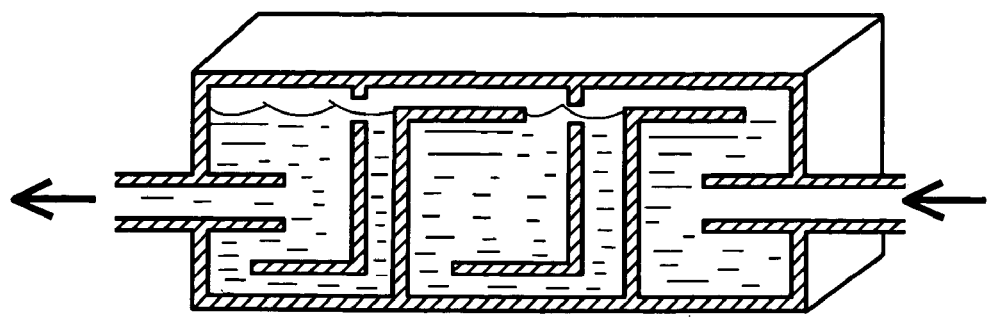

FIGS. 4(a) and 4(b) are views of showing the conditions of two (2) pieces of check valves, in particular, when they are under the normal operation condition, for explaining the operation of the redundant cooling system mentioned above;

FIG. 5 is a block diagram for showing the structure of the redundant cooling system mentioned above, in particular, when one of circulation pumps is stopped;

FIGS. 6(a) and 6(b) are views of showing the conditions of the two (2) pieces of check valves, in particular, when one of the circulation pumps is stopped, for explaining the operation of the redundant cooling system mentioned above;

FIG. 7 is a block diagram for showing the structure of the redundant cooling system mentioned above, in particular, when the other of circulation pumps is stopped;

FIGS. 8(a) and 8(b) are views of showing the conditions of the two (2) pieces of check valves, in particular, when the other of the circulation pumps is stopped, for explaining the operation of the redundant cooling system mentioned above;

FIG. 9 is a block diagram for explaining the structure of a control system, within the redundant cooling system mentioned above;

FIGS. 10(a) and 10(b) are flowcharts for explaining an example of the operation of the control system, which is carried out within the redundant cooling system mentioned above;

FIGS. 11(a) and 11(b) show a block diagram for showing the electronic apparatus having a liquid cooling system therein, according to other embodiment of the present invention, and also the condition of a three-way valve provided therein, in particular when it is under the normal operation condition thereof;

FIGS. 12(a) and 12(b) show a block diagram for showing the electronic apparatus having the liquid cooling system, according to the other embodiment of the present invention, and also the condition of the three-way valve, in particular, when one of the circulation pumps is stopped;

FIGS. 13(a) and 13(b) show a block diagram for showing the electronic apparatus having the liquid cooling system, according to the other embodiment of the present invention, and herein also the condition of the three-way valve, in particular, when the other of the circulation pumps is stopped;

FIG. 14 is a perspective view for showing the redundant cooling system within the electronic apparatus, according to further other embodiment of the present invention;

FIGS. 15(a) and 15(b) are perspective views, including the vertical cross-section thereof, for showing a coolant tank to be used in the redundant cooling system mentioned above, corresponding to various disposition conditions thereof, for storing a liquid coolant therein; and FIGS. 16(a) and 16(b) are also perspective views, including the vertical cross-section thereof, for showing the coolant tank to be used in the redundant cooling system mentioned above, corresponding to various disposition conditions thereof, for storing the liquid coolant therein.

DETAILED DESCRIPTION OF THE INVENTION

Hereinafter, explanation will be given on the embodiments according to the present invention, in details thereof, by referring to the drawings attached herewith.

Figure 2:
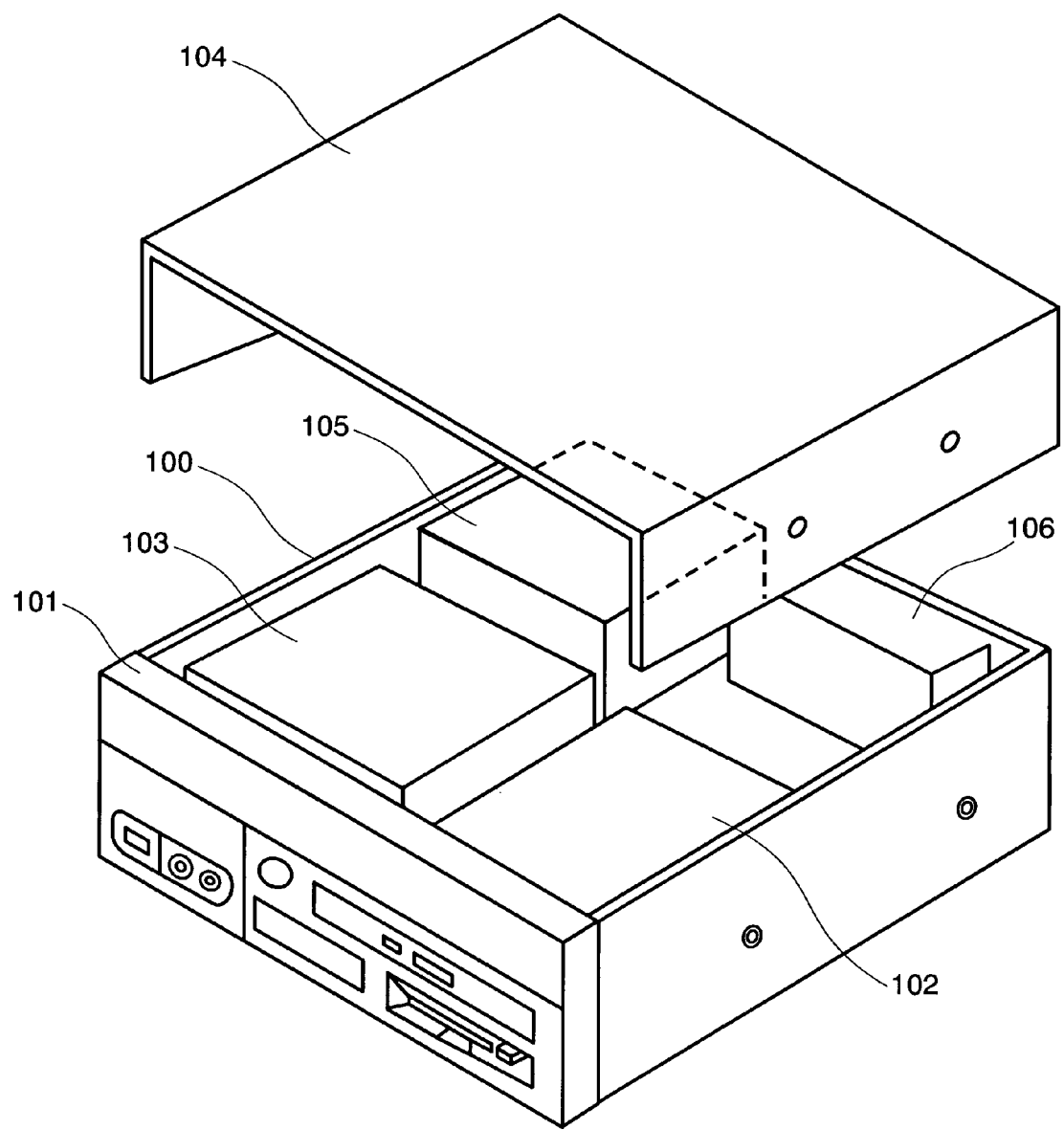
FIG. 2 is a perspective view of a desktop type personal computer, partially exploded therein, which mounts the redundant cooling system mentioned above therein, for showing the disposition of each of portions provided within an inside thereof, for example.

First of all, FIG. 2 attached herewith shows an example of the entire structure of an electronic apparatus having a liquid cooling system therein, according to one embodiment of the present invention. However, in this embodiment is shown a case, where the present invention is applied into a main part or portion of a personal computer, such as, of being so-called the desktop type, for example.

As shown in the figure, the main portion of the desktop type personal computer comprises a housing 100, which is formed from a metal plate into a cubic shape thereof, for example, and on a front panel portion 101 thereof are provided various kinds of switches; including an electric power switch and so on, and also indicator lamps, etc. Also, within an inside thereof is disposed a driver device 102, for driving various kinds of external information recording medium; such as, a floppy disk, a CD, and a DVD, etc., so that it positions an opening thereof on the front panel portion 101. Also, a reference numeral 103 in the figure depicts a memory portion provided within the housing 100 mentioned above, comprising a hard disk device, for example. And also, a reference numeral 104 in the figure depicts a cover to be put on the housing 100 mentioned above.

While on a rear side of the housing 100 is disposed an electronic circuit portion 105, having a liquid cooling system according to the present invention, and a reference numeral 106 in the figure depicts an electric power source portion for supplying from a commercial electric power source, a desired electric power to each of the portions, including, the driver device 102, the memory portion 103, and the electronic circuit portion 105 mentioned above.

Figure 1:
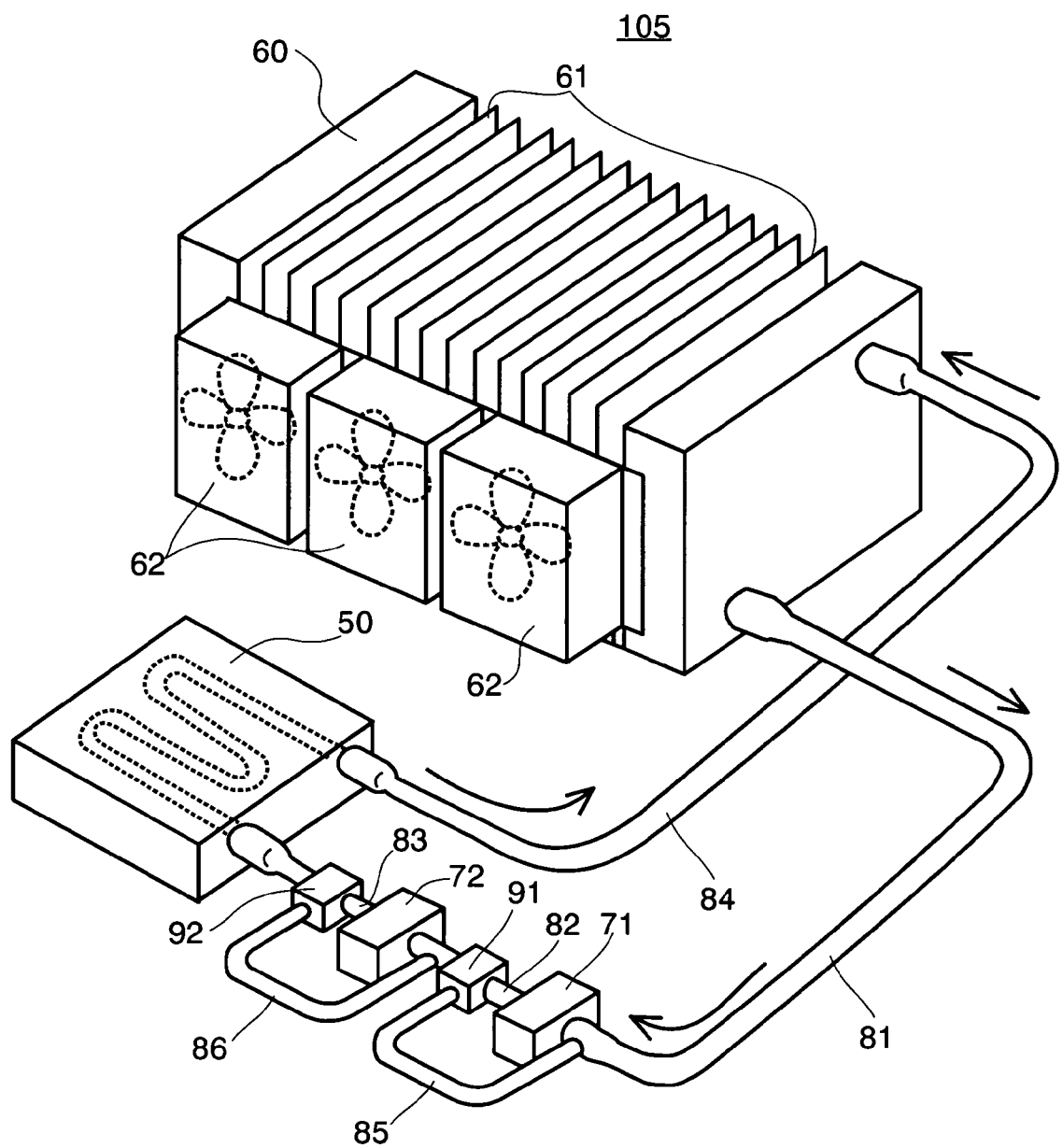
FIG. 1 is a perspective view for showing the structure of a redundant cooling system, in particular, of an electronic circuit portion within an electronic apparatus, according to the present invention.

Next, in FIG. 1 attached herewith is shown the electronic circuit portion 105 of the electronic apparatus, the brief structure of which was explained in the above; i.e., within the desktop type personal computer, in particular, mainly around a heat receiving jacket 50 for mounting thereon a heat-generation element, such as, a CPU, as a main or principle structure thereof. However, in this embodiment, a chip 200 of the CPU, being such the heat-generation element as was mentioned, is mounted on a lower side surface of the heat-receiving jacket 50 mentioned above, being in contact with, directly, therefore it is not illustrated on the figure, herein.

And, as is apparent from the figure, this electronic circuit portion 105 comprises the above-mentioned heat-receiving (or cooling) jacket 50 for mounting the CPU thereon, a radiator portion 60 for radiating heat generated from the CPU into an outside of the apparatus, a plural number (in the present example, two (2) pieces) of circulation pumps 71 and 72 for building up a redundant cooling system, and further flow passages are formed by connecting tubes (conduits) 81, 82 . . . , each being made of a metal, or an elastic material, such as a rubber or the like, being covered with a metal film, etc., on the outer surface thereof, so as to prevent the liquid coolant inside from leaking outside, for communicating a liquid coolant (for example, a water, or a mixture of water with a so-called anti-freezing solution, such as, propylene glycol, at a predetermined ratio thereof) to each of those portions building up the heat cycle. Also, in a part of the radiator portion 60 mentioned above, there are attached with plate-like shaped fans 62, 62 . . . (in the present example, a plural number, such as, three (3) pieces), directing into an outside of the apparatus, for blowing an air onto a large number of fins 61, as the constituent element of the radiator portion, thereby radiating the heat transmitted from the heat receiving jacket 50 mentioned above, compulsively. Further, this heat-receiving (or cooling) jacket 50 is a plate-like member, being made of a metal having high heat conductivity, such as cupper or the like, and being formed with a cooling passage within an inside thereof, to communicate the liquid coolant into the passage thereof, thereby removing (moving) the heat generated from the CPU into the outside.

Figure 3:
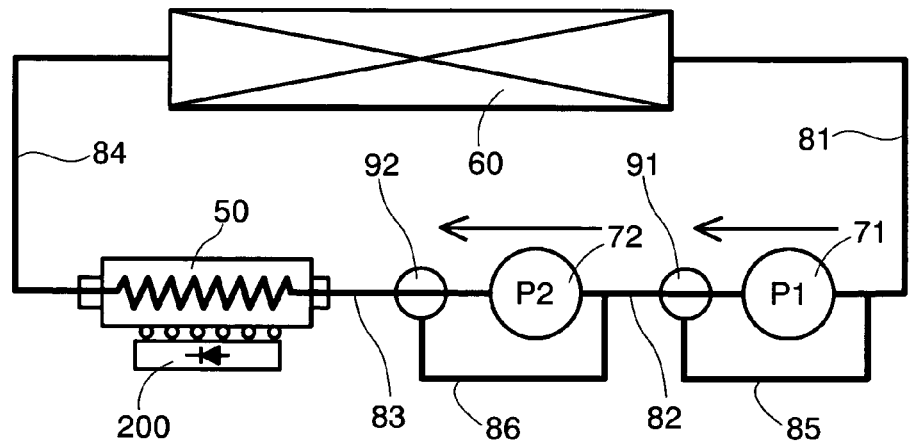
FIG. 3 is a block diagram for showing the structure of the redundant cooling system mentioned above, in particular, when it is under the normal operation condition thereof.

Following to the above, FIG. 3 attached herewith shows the structure of the redundant cooling system, including therein the heat-receiving jacket 50 and the radiator 60 mentioned above, in the form of a block diagram. Namely, as is apparent from this figure, the radiator 60 mentioned above is connected to a first circulation pump P1 via the tube (or conduit) 81, and further, it is connected to a second circulation pump P2 via the tube (or conduit) 82. And, this second circulation pump P2 is connected to the heat-receiving jacket 50 mentioned above, via the tube (or conduit) 83, and thereafter is turned back to the radiator 60, again, via the tube (or conduit) 84, thereby building up a loop. Namely, in the present embodiment, the first circulation pump P1 (71) and the second circulation pump P2 (72) mentioned above are connected in a so-called series connection. In addition thereto, in each of the first circulation pump P1 and the second circulation pump P2, there are provided tubes (or conduits) 85 and 86 connecting across an inlet and an outlet thereof, respectively, and further on each of the outlet (or discharge) sides thereof is connected a check valve 91 or 92, respectively, but the details of which will be explained later. However, it is needless to say that the above-mentioned water or the water mixture with the anti-freezing solution circulates within the liquid circuit mentioned above, as the liquid coolant.

Thus, according to the redundant cooling system having such the structure as was mentioned above, with an aid of operations of the circulation pumps 71 and 72 in a plural number thereof (e.g., two (2) pieces, in this example), it is possible to obtain the cooling mechanism having redundancy. In more details thereof, with such the structure mentioned above, in a case where the two (2) pieces of circulation pumps 70 and 71 are under the normal operation, but without any trouble therein, the liquid coolant flowing within the cooling system runs along with a route indicated by an arrow in FIG. 4(a) attached, due to the function of the two (2) pieces of the circulation pumps 71 and 72. Further, the conditions of those two (2) pieces of check valves 91 and 92 in this instance are shown in FIGS. 4(a) and 4(b) attached herewith. Namely, the liquid pressure (p71) or (p72) of the coolant discharged from each of the pumps is larger than the liquid pressure (p85) or (p86) within the tube (or conduit) 85 or 86 building up the bypass passage thereof, and for this reason, a ball valve 911 or 921 is pushed down towards a seat 912 or 922. Thus, the liquid coolant, not passing through the bypass passage 85 or 86, but passes through the circulation pumps 71 and 72, thereby circulating within the cooling system. However, the each ball valve 911 or 921 is adjusted, so that it is nearly equal to the specific gravity of the liquid coolant, therefore starting the movement thereof even with a little pressure difference therebetween.

By the way, in a case where, one of the two (2) pieces of circulation pumps 71 and 72, which are provided within the cooling system mentioned above; e.g., the circulation pump 71 stops the function thereof, because of the reasons that an electric motor stops, forming a driving portion thereof (in this case, the motor M1 in the figure), or that a blade of the pump adheres, etc., for example, then almost of the liquid coolant flowing within the cooling system runs along with a route indicated by an arrow in FIG. 5 attached herewith, due to the function of the circulation pump 72 of the other-side. Thus, almost of the liquid coolant from the radiator portion 60, not passing through the circulation pump 71 being in trouble or stoppage, but passes through the tube (or conduit) 85 forming the bypass passage thereof, and thereafter, flows into the heat-receiving jacket 50 passing through the other-side circulation pump 72, which operates normally. Further, the conditions of the two (2) pieces of check valves 91 and 92 in this instance are shown in FIGS. 6(*a*) and 6(*b*) attached herewith.

Namely, in this instance, as shown in FIG. 6(*a*), due to the stoppage of operation in the one-side circulation pump 71, the liquid pressure (p71) discharged from the first pump goes down, so that the ball valve is released or comes away from the seat 912, thereby opening the bypass passage. However, since the other-side circulation pump 72 still keeps the operation thereof, therefore as shown in FIG. 6(*b*), the liquid pressure (p72) discharged from the second pump is larger than the liquid pressure (p86) within the tube (or conduit) 86 building up the bypass passage thereof, and therefore the ball valve 921 is pushed down to the seat 922, i.e., the bypass passage being closed. Thus, the liquid coolant passes through the bypass passage 85, and thereafter passes through the circulation pump 72, the second one, thereby circulating within the cooling system.

On the other hand, in a case when the other of the two (2) pieces of the circulation pumps 71 and 72, which are provided within the cooling system mentioned above; e.g., the circulation pump 72 stops the function thereof, also due to the reasons mentioned above, then the almost of the liquid coolant flowing within the cooling system comes to run along with the route indicated by an arrow in FIG. 7 attached herewith, due to the operation of the circulation pump 71 of one-side. Thus, almost of the liquid coolant from the radiator portion 60 mentioned above, passing through the one-side circulation pump 71 operating normally, directs into a direction of the circulation pump 72, which is in trouble or stopped. However, in this instance, because of the stoppage of the circulation pump 72, the liquid coolant, not passing through that circulation pump 72, but passes through the bypass passage thereof, and thereafter, it flows into the heat-receiving jacket 50. The conditions of those two (2) pieces of the check valves 91 and 92 in this instance are shown in FIGS. 8(*a*) and 8(*b*) attached herewith.

Namely, in this instance, as is shown in FIG. 8(*b*), the liquid pressure (p72) of the coolant discharged from the second pump decreases down due to the stoppage of operation in the other-side circulation pump 72, and then the ball valve 921 comes away from the seat 922, thereby opening the bypass passage. However, in this instance, the one-side circulation pump 71 still keeps the operation thereof, and the liquid pressure (p71) discharged from the first pump is larger than the liquid pressure (p85) of the coolant within the tube (or conduit) 85 building up the bypass passage thereof, therefore the ball valve 911 is pushed down to the seat 912; i.e., the bypass passage is closed. Thus, the liquid coolant passes through the one-side circulation pump 71, and thereafter it passes through the bypass passage 86, thereby circulating within the cooling system.

As was mentioned in details thereof, in the above, according to the redundant cooling system mentioned above, even if stopping the function thereof due to the trouble in a part among the circulation pumps, which are provided in the plural number thereof for driving the liquid coolant circulating within the system (in particular, in the example mentioned in the above, one of the two pieces of the circulation pumps 71 and 72 provided therein), the liquid coolant continues to circulate within the system due to the operation of the remaining (or the other thereof), therefore the circulation of the liquid coolant will not be stopped due to the trouble of the circulation pump, as was mentioned about in the conventional arts. Namely, if stopping the one, it is possible to continue the cooling of the CPU carrying a central function of the apparatus, i.e., the heat-generation body; therefore, an electronic apparatus can be provided, having the cooling system therein, being suitable to be applied in the personal computer, being so-called such the desktop type or the notebook type, as mentioned above, and/or the server, etc., being high in the cooling efficiency thereof, as well as, having redundancy therewith.

Herein, though the bypass passage is provided for each of the circulation pumps, respectively, each being able to open when occurring a trouble due to the function of the check valve, in the embodiment mentioned in the above, however this is due to the fact that the circulation pump itself in trouble/stoppage comes to be a large resistance for the liquid coolant circulating within the cooling system, when the circulation pump is in trouble or stopped, so that the circulating liquid coolant is lowed down in flow rate thereof. Also, with the embodiment mentioned above, the explanation was made only about the check valve of the structure using the ball valve therein, however it may have the structure other than that, as far as it can achieve the function mentioned above, but without limiting the structure only thereto.

Further, explanation will be given about a controller system in the redundant cooling system mentioned above, by referring to FIGS. 9 and 10 attached herewith. First, FIG. 9 attached shows the circuit structure of the controller system in the redundant cooling system mentioned above, in the form of a block diagram. Namely, as shown in the figure, there are provided detectors (or sensors) 75 and 76 for the plural number of circulation pump; e.g., the circulation pumps 71 and 72, respectively, in the present embodiment. Mentioning in more details thereof, each of the circulation pumps mentioned above is a flat centrifugal pump, in general, and as a driving source for rotationally driving thereof, also a flat type electric motor is applied, such as, a direct-current (DC) motor, for example; therefore, it is possible to detect the stoppage and/or the trouble of the circulation pump, through detection of a rotation velocity of the DC motor. With some of such the DC motors, there is provided a terminal for outputting a signal indicative of the rotation velocity thereof, and it is also possible to use the output provided at that terminal, in such the case.

And, the detection outputs of those detectors 75 and 76 are inputted through an interface (I/F) portion 201 to the CPU 200, which builds up a portion of the controller system. However, in this figure, together with the above-mentioned CPU 200, there are connected various kinds of memories, in the form of an exterior circuit thereof; such as, a RAM 202, ROM 203, to be used for calculation processing thereof, through a bus 204, however it is possible to build up those as a unit. In addition thereto, an alarm lamp 77 is connected to the interface portion 201 mentioned above, for the purpose of warning the trouble caused in the circulation pump.

Explanation will be made on the basic operation of the controller system within the redundant cooling system, the structure of which was mentioned in the above, upon the basis of programs to be executed by means of the above-mentioned CPU 200 building up the part of the controller system, by referring to FIGS. 10(*a*) and 10(*b*) attached herewith. Further, those programs are executed, alternatively, at a predetermined time period.

First, as shown in FIG. 10(*a*), when this program is started, then the rotation number (i.e., the rotation velocity V1) of the above-mentioned first circulation pump (i.e., the pump P1) is inputted into, through the I/F portion 201 mentioned above (step S11). Following thereto, the rotation velocity V1 inputted is compared with a reference value (Vth), which was preset for determining the trouble of the pump, thereby determining on whether the pump P1 is in the trouble or not (step S12). In the present example, this reference value (Vth) is set to be about 30% of the normal rotation velocity of the pump, for example.

As a result of determination in the step S12 mentioned above, if it is determined that the pump P1 is not in the trouble (see "Yes" in the figure), the process is ended. On the other hand, if it is determined that the pump P1 is in the trouble (see "No" in the figure), the other one of the circulation pumps, i.e., the second circulation pump 72 (the pump P2) rises up the rotation number (the rotation velocity V2) thereof (step S13), and further the alarm lamp 77 is turned ON (step S14). However, an increase of velocity in the step S13 mentioned above is obtained by increasing up the driving voltage thereof, in particular in the case where the DC motor is used as the driving source of the pump, as was mentioned above, thereby setting up the rotation velocity to be 1.5–2 times higher than the normal one.

Following to the above, as is shown in FIG. 10(*b*), the rotation number (the rotation velocity V2) of the second circulation pump (the pump P2) mentioned above is inputted, through the I/F portion 201 mentioned above (step S21). Then, this rotation velocity V2 inputted is also compared with the reference value (Vth), which was preset in advance for determining the trouble of the pump, thereby determining on whether the pump 2 is in the trouble or not (step S22). Thereafter, as a result of the determination, if the pump P2 is not in the trouble (see "Yes" in the figure), the process is stopped. On the other hand, if it is determined that the pump P2 is in the trouble (see "N" in the figure), the other one of the circulation pumps, i.e., the first circulation pump 71 (the pump P1) rises up the rotation number (i.e., the rotation velocity V1) thereof (step 23). Further, the alarm lamp 77 is turned ON (step S24). Further, also in this case, the rotation number (i.e., the rotation velocity V1) of the first circulation pump 71 (the pump P1) is increased up, to be 1.5–2 times higher than the normal one, in the step S23 mentioned above.

Namely, with the function of the controller system in the cooling system mentioned above, if the trouble or the stoppage occurs in a part of the circulation pumps, which are provided in the plural number thereof for the purpose of circulating the liquid coolant within the cooling system, however the circulation of the coolant liquid can be maintained by means of the remaining (or the other) of the circulation pumps, and also with the rise-up of the rotation velocity of said the other, an amount of transportation of the coolant liquid by means of the pumps can be increased up, thereby it is possible to continue the cooling of the heat-generation body, with stability, but without stopping thereof.

Also, it is possible to warn the user of the fact that any trouble occurs in a part of the circulation pumps, by turning ON of the alarm lamp 77 mentioned above, and with this, the user can repair the circulation pump, in a part of which the trouble occurs, or exchange it with a new pump. Even in such the case, however, there is no necessity of stopping the apparatus, immediately, at the same time when the trouble occurs in the cooling system, thereby to repair the circulation pump in which the trouble occurs or exchange it with the new one. Namely, there cannot be caused an inconvenience, that the job with using the personal computer must be stopped, unwillingly, etc. Further, such the function is useful, in particular for the apparatus, being difficult to be stopped on the operation thereof, immediately, if the trouble occurs in the circulation pump, such as, the server, etc. However, the alarm lamp 77 as a means of warning generation of the trouble may be constructed with other means, in the place thereof, such as, a buzzer or a speaker, etc., for generating an alarming sound or voices of alarming thereof, or alternatively, the warning may be displayed on a display device not shown in the figure, which builds up the personal computer therewith.

Following to the above, FIG. 11(*a*) attached herewith shows the structure, according to other embodiment of the present invention, in the liquid cooling system, being provided within the electronic apparatus having a cooling system mentioned above. In this embodiment, the reference numerals same to the above also indicate the similar or same constituent elements in the embodiment mentioned above. Namely, as is clear from this figure, with this other embodiment, two (2) pieces of the circulation pumps 71 and 72 are connected, but in parallel with the flow passage of the liquid coolant, and a three-way valve 90 is attached at the side of a discharge openings of those pumps while omitting the bypass passages mentioned above, in the simple structure thereof. Further, a reference numeral 901 in the figure depicts a ball valve provided within the three-way valve 90 mentioned above, in a manner of being movable. In the present embodiment, the ball valve 901 is also adjusted, to be nearly equal to that of the liquid coolant in the specific gravity thereof.

Also, FIG. 11(*b*) shows the condition of the three-way valve 90 in the case where no trouble occurs in the two (2) pieces of circulation pumps 71 and 72; thus, being under the normal operation thereof. In such the case, the liquid pressure (p71) and (p72) are nearly equal to each other (p71.p72), being discharged from the each of the pumps, respectively. For this reason, the ball valve 901 is located at a central portion, and the liquid coolant passes through those two (2) pieces of circulation pumps 71 and 72, as shown by arrows in the figures, thereby circulating within the cooling system.

While, as is shown in FIGS. 12(*a*) and 12(*b*) attached herewith, when the liquid pressure (p71) is lowered down (p71<p72), being discharged from the first pump, due to the stoppage of the one-side circulation pump 71, then the ball valve 901 of the three-way valve 90 mentioned above moves upwards in the figure, thereby closing the flow passage at the side of the circulation pump 71 stopped. With this, only the coolant discharged from the other-side circulation pump 72 circulates within the cooling system.

On the other hand, as shown in FIGS. 13(*a*) and 13(*b*), if the other-side circulation pump 72 stops the operation thereof, the liquid pressure (p72) discharged from the second pump goes down (p71>p72). Then, the ball valve 901 of the three-way valve 90 moves downwards in the figure, thereby closing the flow passage at the side of the circulation pump 72 stopped. With this, only the coolant discharged from the one-side circulation pump 71 circulates within the cooling system.

As is clear from the above, also with the structure according to the other embodiment mentioned above, in the similar manner to that of the embodiment mentioned above, the liquid coolant keeps the circulation within the system, if one of those circulation pumps 71 and 72 stops, which are provided in the plural number thereof (i.e., two (2) pieces in the present embodiment), due to the function of the remaining (or other) circulation pump, therefore there is no chance that the liquid coolant stops the circulation thereof due to the trouble in the circulation pump, as was mentioned in the conventional arts. Thus, since it is possible to continue the cooling of the heat-generation body, such as the CPU carrying the central function of the apparatus, even if the one of the pumps stops; therefore, an electronic apparatus can be provided, having the cooling system therein, being suitable to be applied in the personal computer, being so-called such the desktop type or the notebook type, as mentioned above, and/or the server, etc., being high in the cooling efficiency thereof, as well as, having redundancy therewith. Also with the structure according to this other embodiment, it is obvious matter for the person skilled in the art, to apply the controller system therein, which is shown in FIGS. 9 and 10 mentioned above.

Also, with the embodiments mentioned above, in particular, the tubes (or, the conduits) 82, 83 . . . , connecting between the check valves 91 and 92 shown in FIG. 1, may be formed in one body together with the circulation pumps 71 and 72, respectively, or the entire of those may be integrated in one body. Further, also with the tubes (or the conduits) provided on the three-way valve 90 and therebetween, they may be made up into one body, together with the circulation pumps 71 and 72 mentioned above. In particular, in the case where those portions are made up into one body, it may be preferable in the structure, because of an easy attachment thereof in an assembling works. Also, with the embodiments mentioned above, though the explanation was given only about the case where the present invention is applied into the personal computer of the desktop type, in particular; however, it would be apparent that the present invention can be also applied into the server, etc., in the similar manner as was mentioned in the above. Also, in a case where the present invention is applied into the personal computer, of so-called the notebook type, in particular, with such the radiator 60 as was mentioned above, in the place of those having the large number of fins 61 and the blowing fans 62 mentioned previously, a heat radiation plate is adopted, which is made up with winding around a metal pipe on a flat plate of metal, and this is attached on a rear surface side of the liquid crystal display provided on the side of the cover.

Following to the above, FIG. 14 shows the redundant cooling system, according to further other embodiment of the present invention, mainly around the heat-receiving jacket 50, on which the CPU is mounted, in the similar manner as in FIG. 1 mentioned above. Also in this embodiment, the reference numerals same to those shown in FIG. 1 mentioned above depict the same or similar constituent elements in the embodiment mentioned above. Thus, as is apparent from this figure, according to the further other embodiment, a coolant tank 200 is further provided between the radiator 60 mentioned above and the two (2) sets of circulation pumps 71 and 72, building up the redundant cooling system, for the purpose of storing or accumulating the liquid coolant circulating within the system; e.g., the water or the mixture of the water and the anti-freezing solution, such as, propylene glycol or the like, in an inside thereof. However, there may be cases where, this coolant tank 200 is located horizontally, as is indicated by solid lines in the figure, or vertically, as is indicated by broken lines in the figure, for example, depending upon the restriction of the space within an inside thereof, when it is disposed within the inside of the housing 100 of the desktop-type personal computer shown in FIG. 2 in the above. Or, there may be cases, where the housing 100 itself (see FIG. 2), installing the cooling system therein, is located horizontally or vertically, depending upon the condition thereof.

Further saying thereof, within the housing of an electronic apparatus, such as 1U server, for example, having a low ceiling and only a narrow space defined therein, the tank 200 must be flat in the configuration thereof, thus, being large in the aspect ratio between the length and the breadth. In this case, if the tank 200 having only one space defined therein is installed, directing the longer direction thereof horizontally, the liquid surface fluctuates largely within the tank 200 even if the housing swings a little bit, and upon the impulse of that moment, there is a possibility that babbles go out into the downstream, i.e., the side of the circulation pumps.

Then, this coolant tank 200 has the structure, as shown in FIGS. 15(a) and 15(b) attached herewith, wherein the coolant storage space defined within the inside thereof is divided into a plural number of spaces (for example, three (3) spaces SP1, SP2 and SP3, in the present embodiment), with forming labyrinth by combining partition walls 201, 202, 203 and 204, each having about "L"-like cross-section shape. Also, a reference numeral 205 in the figure indicates an inlet for the liquid coolant flowing into from the radiator 60 mentioned above, and 206 an outlet for the liquid coolant flowing out into the circulation pump mentioned above (in more details, the first pump 71). Further, reference numerals 206 and 207 indicate portions of the partition walls 202 and 204 having the "L"-like cross-section; thus, where each opening portion is formed at the position in vicinity of an outer periphery of the tank.

In accordance with the coolant tank 200 having such the structure therein, as is apparent from those FIGS. 15(a) and 15(b) mentioned above, if a bubble flows into the inlet 204 of the tank, mixing into a portion of the liquid coolant while the portion thereof leaks out through vaporization, etc., into an outside thereof, during it circulates within the cooling system, however, only the liquid coolant, excluding the bubble therefrom, is always sent out from the outlet 205 to the circulation pumps mentioned above, and therefore, in particular, when adopting the centrifugal pump therein, no idling occurs when it starts the operation thereof, thereby obtaining the pumping function of the liquid coolant, with certainty.

Alternatively, even if the housing 100 itself is disposed in reverse, upside down to the regular disposition thereof, however as is shown in FIGS. 16(a) and 16(b), the bubbles included within the liquid coolant can be stayed within the three (3) spaces SP1, SP2 and SP3, with certainty. For this reason, it is possible to increase the reliability of the pumps, greatly.

Further, when the housing is turned back to the regular potion, an air contained within the tank 200 passes through the opening portions 206 and 207, back to the condition thereof, being close to the original one, as shown in FIGS. 15(a) and 15(b) in the above. In more details, for example, when the tank is changed in direction from the condition shown in FIG. 16(b) to that shown in FIG. 15(b), also the air inside passes through the opening portions 206 and 207, and moves swiftly into the condition shown in FIG. 15(b).

As was fully explained in the above, according to the present invention, there can be provided the liquid cooling system, having the structure suitable to be applied in such the personal computer, being called by the desktop-type or the notebook-type, and also the server, etc., being high in the cooling efficiency, and also having redundancy, as well as, an electronic apparatus having such the system therein.

The present invention may be embodied in other specific forms without departing from the spirit or essential feature or characteristics thereof. The present embodiment(s) is/are therefore to be considered in all respects as illustrative and not restrictive, the scope of the invention being indicated by the appended claims rather than by the forgoing description and range of equivalency of the claims are therefore to be embraces therein.

What is claimed is:

1. An electronic apparatus, installing a semiconductor element generating heat within an inside of a housing, thereby necessitating cooling for maintaining a normal operation thereof, and including a cooling system within the inside of said housing or in a portion thereof, said cooling system comprising:
    a cooling jacket being thermally connected to the semiconductor element, for transmitting heat generated therefrom into a liquid coolant flowing inside thereof;
    a radiator for radiating the heat transmitted into the liquid coolant in said cooling jacket into an outside of the apparatus; and
    a circulation pump for circulating said liquid coolant within a loop, including said cooling jacket and said radiator therein, wherein:
    said circulation pump is provided in a plural number thereof, and further circulation pumps are provided with a bypass channel and a check valve, which has means for detecting malfunction of the circulation pumps.

2. The electronic apparatus having the liquid cooling system therein, as described in the claim 1, wherein two (2) sets of said circulation pumps are connected in series, and said liquid coolant circulation maintaining means comprises flow passages, being connected to said two (2) sets of circulation pumps, respectively, and check valves, each being attached to a portion of each of the flow passages.

3. The electronic apparatus having the liquid cooling system therein, as described in the claim 1, wherein two (2) sets of said circulation pumps are connected in parallel, and said liquid coolant circulation maintaining means comprises a three-way valve connected to said two (2) sets of circulation pumps.

4. The electronic apparatus having the liquid cooling system therein, as described in the claim 1, wherein said liquid coolant circulation maintaining means further comprises a means for increasing rotation velocity of said other circulation pumps when the one of said plural number of circulation pumps stop the function thereof.

5. The electronic apparatus having the liquid cooling system therein, as described in the claim 4, wherein said rotation velocity increase means for the circulation pumps is built up with using a portion of said semiconductor element.

6. The electronic apparatus having the liquid cooling system therein, as described in the claim 4, wherein said liquid coolant circulation maintaining means further comprises an alarm means for warning of stoppage of said function when the one of said plural number of circulation pumps stop the function thereof.

7. The electronic apparatus having the liquid cooling system therein, as described in the claim 1, wherein said liquid cooling system further comprises a tank being able to supply the liquid coolant therefrom, always in spite of dispositional direction thereof.

8. A cooling system, for cooling a semiconductor element generating heat therefrom, comprising:
    a cooling jacket being thermally connected to a semiconductor element, for transmitting heat generated therefrom into a liquid coolant flowing inside thereof;
    a radiator for radiating the heat transmitted into the liquid coolant in said cooling jacket into an outside of the apparatus; and
    a circulation pump for circulating said liquid coolant within a loop, including said cooling jacket and said radiator therein, wherein:
    said circulation pump is provided in a plural number thereof, and further circulation pumps are provided with a bypass channel and a check valve, which has means for detecting malfunction of the circulation pumps.

9. A cooling system, for cooling a semiconductor element generating heat therefrom, comprising:
    a cooling jacket being thermally connected to a semiconductor element, for transmitting heat generated therefrom into a liquid coolant flowing inside thereof;
    a radiator for radiating the heat transmitted into the liquid coolant in said cooling jacket into an outside of the apparatus; and
    a circulation pump for circulating said liquid coolant within a loop, including said cooling jacket and said radiator therein, and further comprising:
    a coolant tank, being divided in an inside thereof into a plural number of spaces, wherein each space includes at least one L-shaped wall member for trapping air inside the space in an upstream side of said circulation pump.

* * * * *